United States Patent [19]
Peterzell et al.

[11] Patent Number: 5,722,063
[45] Date of Patent: Feb. 24, 1998

[54] METHOD AND APPARATUS FOR INCREASING RECEIVER IMMUNITY TO INTERFERENCE

[75] Inventors: Paul E. Peterzell; Richard K. Kornfeld, both of San Diego; Charles E. Wheatley, III, Del Mar; Ana Weiland, Encinitas, all of Calif.

[73] Assignee: Qualcomm Incorporated, San Diego, Calif.

[21] Appl. No.: 357,951

[22] Filed: Dec. 16, 1994

[51] Int. Cl.$^6$ .................................... H04B 1/10
[52] U.S. Cl. .......... 455/287; 455/13.4; 455/217; 455/234.1; 455/250.1; 455/245.1; 455/67.1
[58] Field of Search ................. 455/250.1, 254, 455/268, 283, 287, 311, 338, 341, 13.4, 63, 67.1, 161.3, 217, 219, 226.1, 226.2, 232.1, 234.1, 240.1, 245.1, 245.2, 83, 86

[56] References Cited

U.S. PATENT DOCUMENTS

| | | | |
|---|---|---|---|
| 3,060,381 | 10/1962 | Turner et al. | 455/217 |
| 3,587,017 | 6/1971 | Kurusu | 455/217 |
| 4,525,863 | 7/1985 | Stites | 455/83 |
| 4,718,114 | 1/1988 | Brandt | 455/83 |
| 4,853,972 | 8/1989 | Ueda et al. | 455/83 |
| 5,093,840 | 3/1992 | Schilling | 375/1 |
| 5,193,210 | 3/1993 | Nicholas et al. | 455/226.1 |
| 5,230,096 | 7/1993 | Davies et al. | 455/287 |
| 5,276,912 | 1/1994 | Siwiak et al. | 455/86 |
| 5,321,847 | 6/1994 | Johnson, Jr. | 455/63 |
| 5,339,454 | 8/1994 | Kuo et al. | 45/254 |
| 5,390,345 | 2/1995 | Wada et al. | 455/234.1 |
| 5,457,811 | 10/1995 | Lemson | 455/67.1 |
| 5,507,023 | 4/1996 | Suganuma | 455/234.1 |
| 5,513,386 | 4/1996 | Ogino et al. | 455/254 |
| 5,564,094 | 10/1996 | Anderson et al. | 455/295 |

FOREIGN PATENT DOCUMENTS

| | | | |
|---|---|---|---|
| 0342671 | 11/1989 | European Pat. Off. | H03G 3/20 |
| 506163 | 9/1992 | European Pat. Off. | 359/179 |
| 0622907 | 11/1994 | European Pat. Off. | H03B 1/38 |
| 2239494 | 11/1980 | Germany | 455/287 |
| 0053931 | 4/1980 | Japan | 359/179 |
| 9107037 | 5/1991 | WIPO | H04L 27/30 |

*Primary Examiner*—Leslie Pascal
*Attorney, Agent, or Firm*—Russell B. Miller; Roger W. Martin

[57] ABSTRACT

The method and apparatus of the present invention improve the immunity to interference of a radio receiver. The power level of a received signal is detected. If the power level meets or exceeds a predetermined power threshold, the low noise amplifier is by-passed, thus increasing the intercept point of the receiver components.

Alternative embodiments include the use of an RF power detector to control the front-end gain as a function of jammer power. In lieu of a switchable RF gain block, several methods of continuous gain control are proposed. Continuous gain control allows the interference suppression and sensitivity of the receiver to be adjusted at lower signal levels than the switchable gain block.

10 Claims, 13 Drawing Sheets

METHOD AND APPARATUS FOR INCREASING RECEIVER IMMUNITY TO INTERFERENCE

BACKGROUND OF THE INVENTION

I. Field of the Invention

The present invention relates to radio communications. More particularly, the present invention relates to improving a communication receiver's immunity to interference.

II. Description of the Related Art

There are presently multiple types of cellular radiotelephone systems operating. These systems include the advanced mobile phone system (AMPS) and the two digital cellular systems: time division multiple access (TDMA) and code division multiple access (CDMA). The digital cellular systems are being implemented to handle capacity problems that AMPS is experiencing.

All the cellular radiotelephone systems operate by having multiple antennas covering a geographic area. The antennas radiate into an area referred to in the art as a cell. The AMPS cells are separate and distinct from the CDMA cells so that the cells of each system overlap. This makes it likely that the antenna for one system's cell may be located in a cell of another system. Likewise, within a particular system (AMPS, CDMA, and TDMA), there are two service providers within a given area. These providers often choose to place cells in different geographical locations from their competitor, hence there are situations where a radiotelephone on system 'A' might be far away from the nearest system 'A' cell while close to a system 'B' cell. This situation means that the desired receive signal will be weak in the presence of strong multi-tone interference.

This intermixing of system antennas can cause problems for a mobile radiotelephone that is registered in one system, such as the CDMA system, and travels near another system's antenna, such as an AMPS antenna. In this case, the signals from the AMPS antenna can interfere with the CDMA signals being received by the radiotelephone due to the proximity of the radiotelephone with the AMPS cell or the higher power of the AMPS forward link signal.

The multi-tone interference encountered by the radiotelephone from the AMPS signals creates distortion products or spurs. If these spurs fall in the CDMA band used by the radiotelephone, they can degrade receiver and demodulator performance.

It is frequently the case in an AMPS system for the carriers (A and B bands) to 'jam' the competitor system unintentionally. The goal of the cellular carrier is to provide a high signal to noise ratio for all the users of their system by placing cells close to the ground, or near their users, and radiating the FCC power limit for each AMPS channel. Unfortunately, this technique provides for better signal quality for the carrier's system at the expense of interfering with the competitor's system.

Intermodulation distortion, such as that caused by the above situations, is defined in terms of the peak spurious level generated by two or more tones injected into a receiver. Most frequently, the third-order distortion level is defined for a receiver in terms of a third-order input intercept point or IIP3. IIP3 is defined as the input power (in the form of two tones) required to create third order distortion products equal to the input two tone power. As shown in FIG. 13, IIP3 can only be linearly extrapolated when a non-linear element, such as an amplifier, is below saturation.

As shown in FIG. 14, third-order distortion products occur when two tones are injected in a receiver. Tone #1 is at frequency $f_1$ at power level $P_1$ in dBm. Tone #2 is at frequency $f_2$ at power level $P_2$ in dBm. Typically $P_2$ is set to equal $P_1$. Third-order distortion products will be created at frequencies $2xf_1-f_2$ and $2xf_2-f_1$ at power levels $P_{12}$ and $P_{21}$ respectively. If $P_2$ is set to equal $P_1$, then spurious products should be equal, or $P_{12}$ and $P_{21}$ should be equal. Signal $f_c$ is injected at power level $P_c$ to show that the added distortion is equal to a low level signal in this case. If there is a filter that filters out $f_1$, $f_2$ and $f_{21}$ after the distortion is created, the power at $f_{12}$ will still interfere with the signal power at $f_c$. In example FIG. 14, for a CDMA application, the goal is that the intermod $P_{12}$ should be equal to the signal power of $-105$ dBm for a total two tone power of $-43$ dBm, so the IIP3 must be $>-9$ dBm.

As is well known in the art, IIP3 for a single non-linear element is defined as the following:

$$IIP3 = IM3/2 + P_{in} \text{ (dBm)}$$

If $P_1 = P_2$, then $P_{in} = P_1 + 3$ dB or $P_2 + 3$ dB (dBm)

and $$IM3 = P_1 - P_{12} = P_2 - P_{21} = P_2 - P_{12} = P_1 - P_{21} \text{ (dB)}$$

For cascaded IIP3, where more non-linear elements are used, the equation is as follows:

$$IIP3 = -10 * \log 10[10^{(Gain-element\ IIP3)/10} + 10^{(-IIP3\ of\ previous\ stages)/10}]$$

where: Gain=gain to element input.

Therefore, one way to improve the cascaded IIP3 of a receiver is to lower the gain before the first non-linear element. In this case, the LNA and mixer limit IIP3. However, another quantity needs to be defined that sets the sensitivity or lowest receive signal level without interference. This quantity is referred to in the art as the noise figure (NF). If the gain of the receiver is reduced to improve IIP3 (and interference immunity), the NF (and sensitivity to small desired signals) is degraded.

The Element NF is defined as the following:

$$\text{Element NF} = S_i/N_i - S_o/N_o \text{ (dB)},$$

where: $S_i/N_i$ is the input signal to noise ratio in dB, and $S_o/N_o$ is the output signal to noise ratio in dB.

For elements in cascade in a receiver, the equation is as follows:

$$\text{Cascaded } NF = 10 * \log 10 \left[ 10^{(NFi/10)} + \frac{10^{(NFe/10)} - 1}{10^{(Gain/10)}} \right],$$

where: NFe equals the noise figure of the element,

NFi equals the cascaded noise figure up to the element, and

Gain equals the running gain up to the element.

The 'best' cascaded NF can be achieved if the gain up to the element is maximized, this equation is in contradiction to the requirement for the 'best' cascaded IIP3. For a given element by element and receiver NF and IIP3, there are a limited set of gain values for each element that meet all of the requirements.

Typically, a receiver is designed with NF and IIP3 as predefined constants, as both of these quantities set the receiver's dynamic range of operation with and without interference. The gain, NF, & IIP3 of each device are optimized based on size, cost, thermal, quiescent and active element current consumption. In the case of a dual-mode CDMA/FM portable cellular receiver, the CDMA standard requires a 9 dB NF at minimum signal. In other words, for CDMA mode, the sensitivity requirement is a 0 dB S/N ratio at −104 dBm. For FM mode, the requirement is a 4 dB S/N ratio at −116 dBm. In both cases, the requirements can be translated to a NF as follows:

NF=S (dBm)−S/N (dB)−$N_{therm}$ (dBm/Hz)−Signal BW (dB/Hz), where S is the minimum signal power, S/N is the minimum signal to noise ratio, $N_{therm}$ is the thermal noise floor (−174 dBm/Hz @290° K), and Signal BW (dB/Hz) is the bandwidth of the signal. Therefore, CDMA NF=−104 dBm−0 dB−(−174 dBm/Hz)−61 dB/Hz=9 dB, FM NF=−116 dBm−4 dB−(−174 dBm/Hz)−45 dB/Hz=9 dB, where −61 dBm/Hz is the noise bandwidth for a CDMA channel −45 dBm/Hz is the noise bandwidth for a FM channel However, the receiver's NF is only required when the signal is near the minimum level and the IIP3 is only required in the presence of interference or strong CDMA signals.

There are only two ways to provide coverage in the areas where the carrier is creating strong interference. One solution is to employ the same technique; i.e., co-locate their cells along with the competition's. Another solution is to improve the immunity of a receiver to interference. One way to improve the immunity is to increase the receiver current. This is not a practical solution, however, for a portable radio that relies on battery power. Increasing the current would drain the battery more rapidly, thereby decreasing the talk and standby time of the radiotelephone. There is a resulting need to minimize multi-tone interference in a radiotelephone without impacting the current consumption.

SUMMARY OF THE INVENTION

The apparatus of the present invention encompasses a device to increase a radio receiver's immunity to interference without the drawback of degrading standby and talk time for a portable radiotelephone. The apparatus is comprised of an amplifier coupled to a received signal, the amplifier amplifying the received signal. A receive automatic gain control is coupled to the amplifier. A power detector is coupled to the receive automatic gain control output, the power detector adjusts the receive automatic gain control in response to a detected power of the received signal.

DESCRIPTION OF THE PREFERRED EMBODIMENT

It is an objective of the present invention to vary the receiver NF and IIP3 for enhancing the IIP3 (or interference immunity) without compromising NF when necessary. This performance 'enhancement' is accomplished by varying the gain of the first active element in the receiver. The gain can be varied by varying the gain of the LNA over a continuous range or switching out the low noise amplifier with bypass switches.

Figure 1:
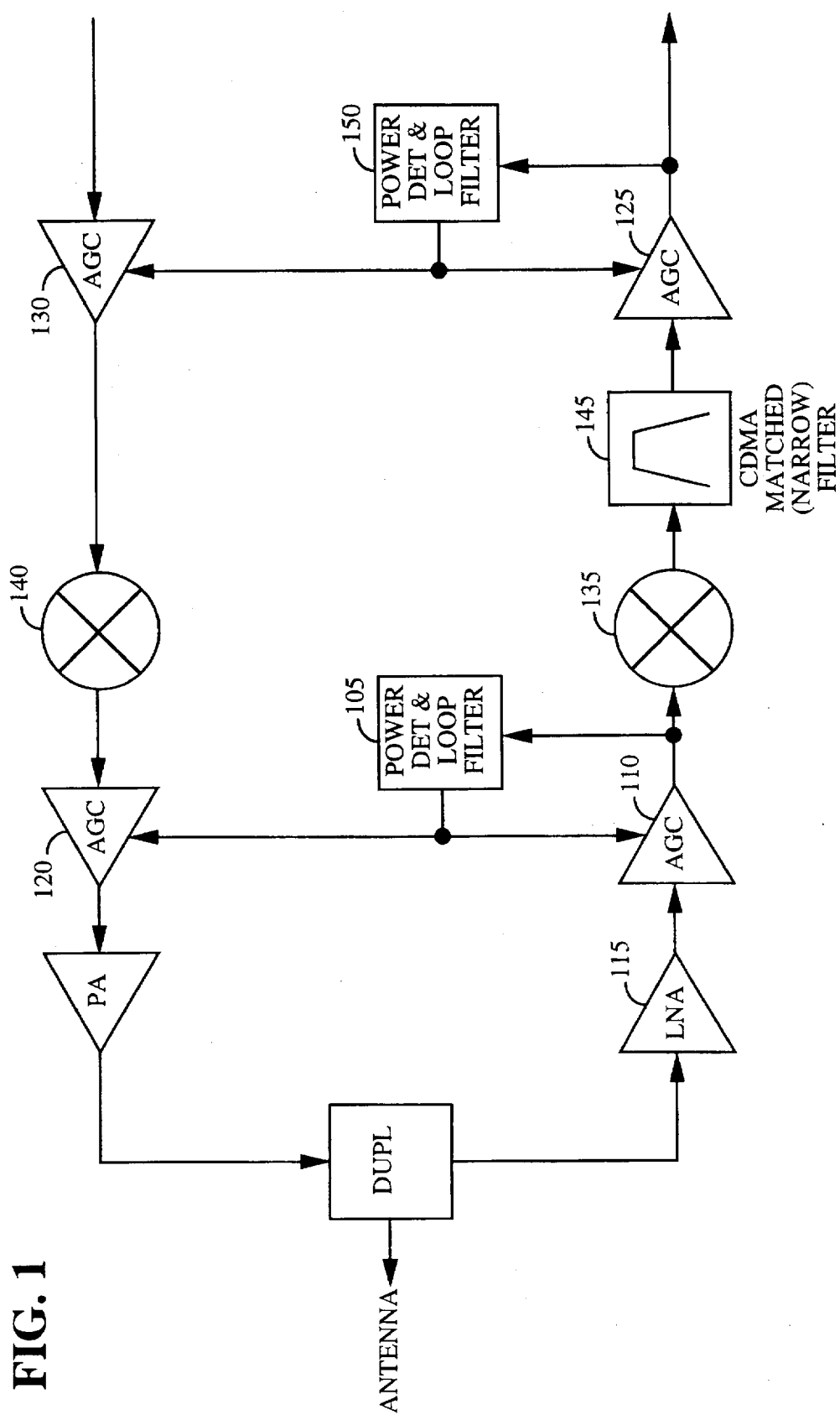
FIG. 1 shows a block diagram of the apparatus of the present invention for increasing receiver immunity.

A block diagram of the preferred embodiment of the present invention is illustrated in FIG. 1. This embodiment involves adjusting the LNA gain on a continuous basis using adjustable gain control (AGC) at the receiver front end. The continuous AGC at the front end also provides a linearity benefit at a minimum RF input level while the AGC on the transmit side may reduce the IF AGC requirements.

This embodiment detects the power output from the LNA. The power detector measures both the signal power and the jammer power together at RF. Using this embodiment, the power detector can continuously decrease the LNA gain at a lower received power than the −65 dBm of the subsequent 'switched gain' embodiments.

The preferred embodiment operates by the power detector (105) detecting the received signal and jammer power at RF. This detected power goes through a loop filter and is used to adjust the receive AGC (110), thereby adjusting the intercept point of the receive components. The gain is decreased as the measured power increases and the gain is increased as the measured power decreases. This embodiment could also combine the LNA (115) and the AGC to form a variable gain LNA, thus eliminating the need for the separate AGC block. The power of the transmit AGC (120), located before the power amplifier, is adjusted in the same way as the receive AGC in order to maintain the overall TX power level.

AGC amplifiers (125 and 130) are also located after the mixers (135 and 140) in order to adjust the gain after the jammers have been filtered out by the bandpass filter (145). These AGC amplifiers (125 and 130) perform the normal CDMA AGC function of open loop power control, closed loop power control, and compensation. These IF AGCs are required due to the wide dynamic range requirements for CDMA. Typically, these AGCs have greater than 80 dB of gain range. The receive and transmit AGC (125 and 130)

after the mixers are adjusted by another power detector (150) that measures the total power after the received signal is downconverted. The power detector (150) adjusts the AGC gain downward as the downconverted signal's power increases and adjusts the AGC gain upward as the downconverted signal's power decreases.

In the preferred embodiment, the received signals are in the frequency band of 869–894 MHz. The transmitted signals are in the frequency band of 824–849 MHz. Alternate embodiments use different frequencies.

Figure 5:
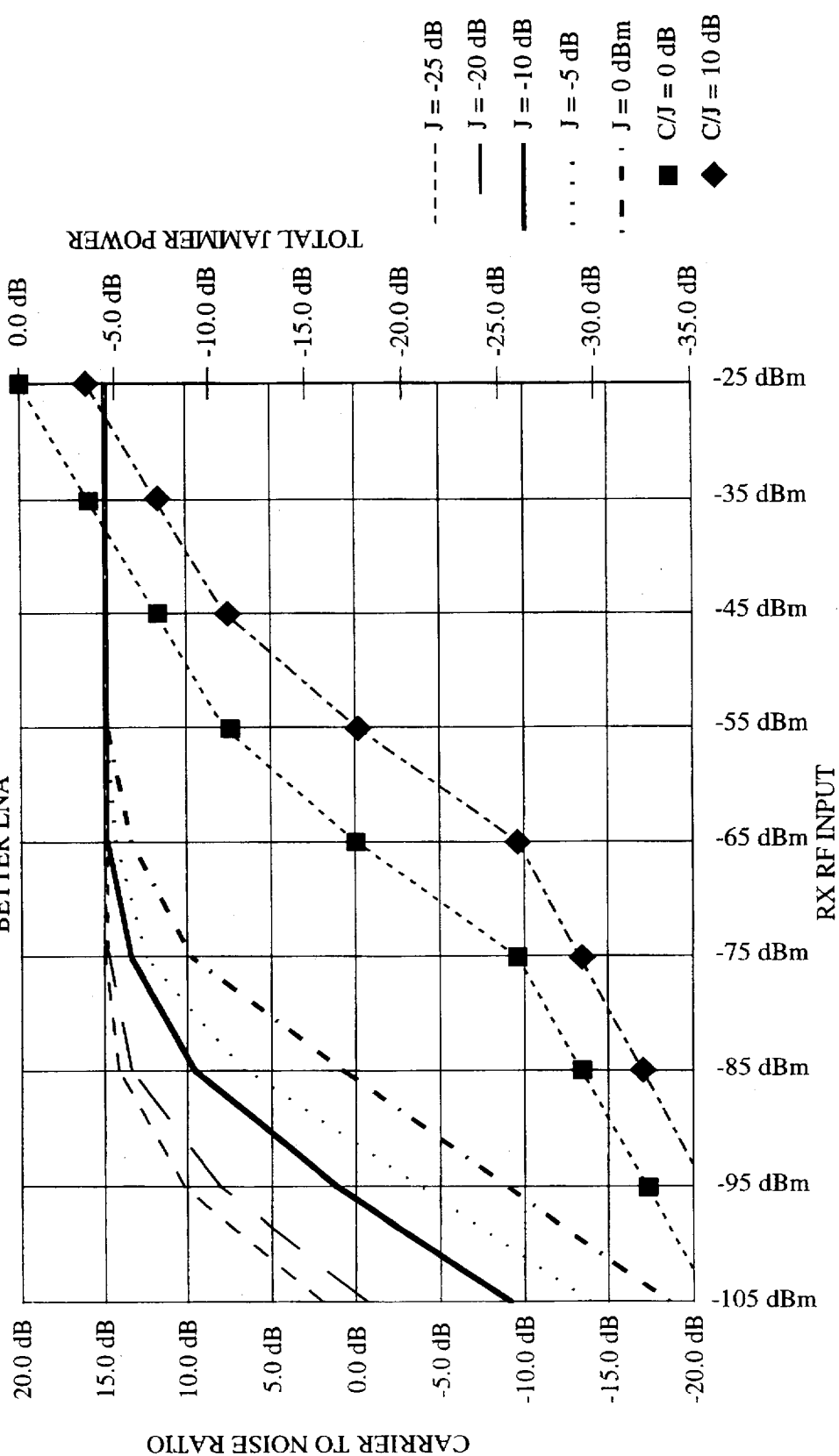
FIG. 5 shows a another plot of received RF input power versus carrier to noise ratio in accordance with the embodiment of FIG. 7.

The plot illustrated in FIG. 5 shows the benefit of this AGC approach. The left hand y-axis shows the carrier over noise ratio versus receive input power parameterized by the jammer level. The right hand y-axis shows the total jammer power required for a constant C/J as a function of received input power. When the jammer is not present (−100 dBm), the radio operates as though there is no RF AGC. As the jammer is increased, the C/N is decreased, but the effective linearity is also increased. In this example, the RF dynamic range is 30 dB and the threshold, where the RF AGC becomes active, is at the point the jammer power is greater than −25 dBm.

Figure 2:
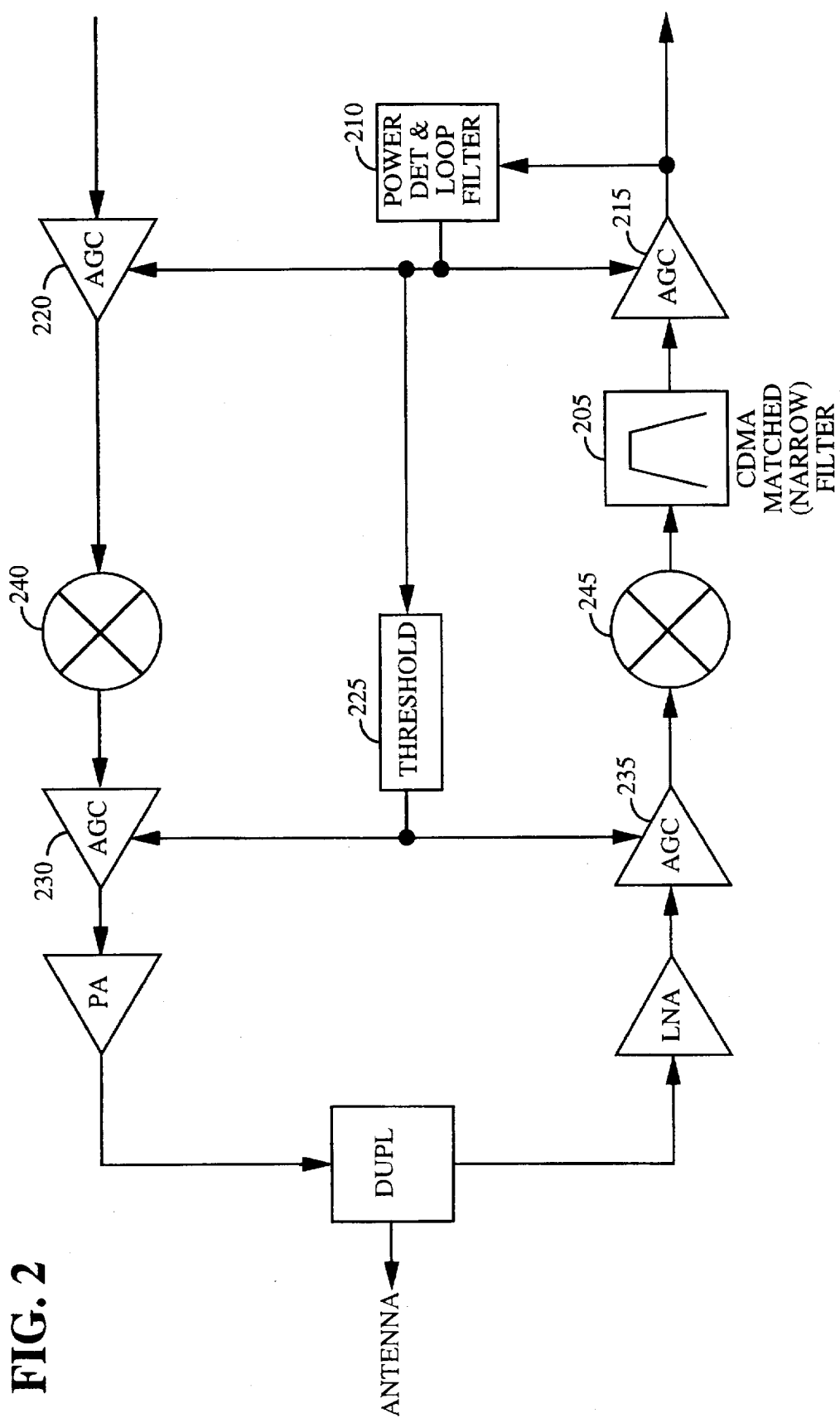
FIG. 2 shows a block diagram of another alternate embodiment of the present invention.

An alternate embodiment of the continuous gain adjustment is illustrated in FIG. 2. This embodiment first filters out the jammers with the bandpass filter (205) before the power detector (210) determines the power level of the downconverted signal. A threshold detector (225) determines when the signal power level reaches a certain point, −105 dBm in this embodiment, and then adjusts the AGC gain (230 and 235) down when the signal power exceeds that power level. The gain is adjusted upward when the signal power level goes below this threshold. The AGC (215 and 220) after the mixers (240 and 245) is adjusted continuously without checking for a predetermined threshold of power. This AGC is the normal CDMA AGC power control.

Figure 6:
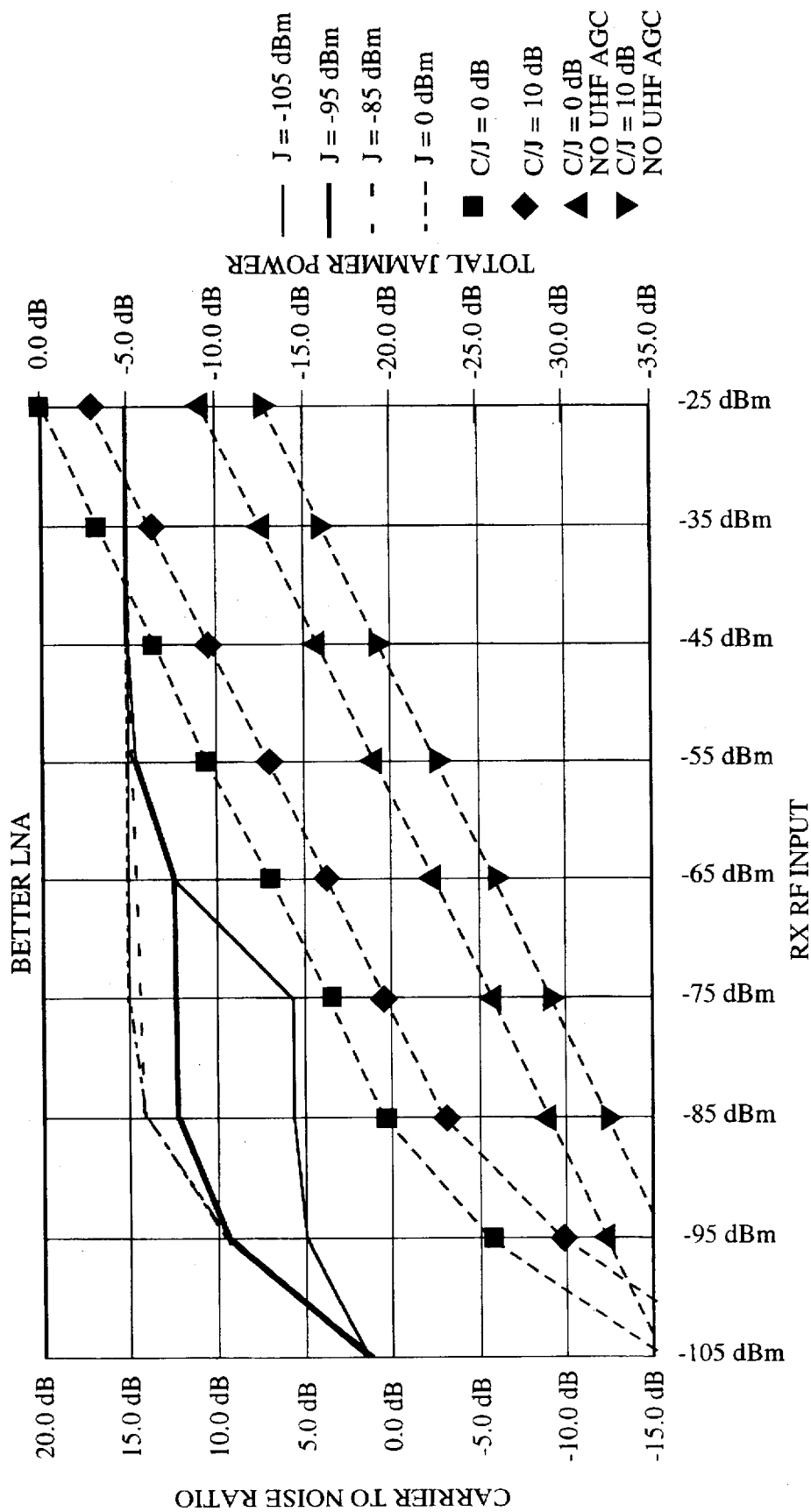
FIG. 6 shows a plot of receive RF input power versus carrier to noise ratio in accordance with the embodiment of FIG. 8.

The plot of this embodiment is illustrated in FIG. 6. When the threshold is set at −105 dBm, the minimum receive RF level, the C/N does not increase as quickly as the case where there is no RF AGC. The advantage of this embodiment is that the linearity benefit begins at a very low RF input power, no receive RF power detector is needed, and the AGC loop detects signal power only. Hence, the AGC loop is a simpler design than detecting at RF power.

Figure 3:
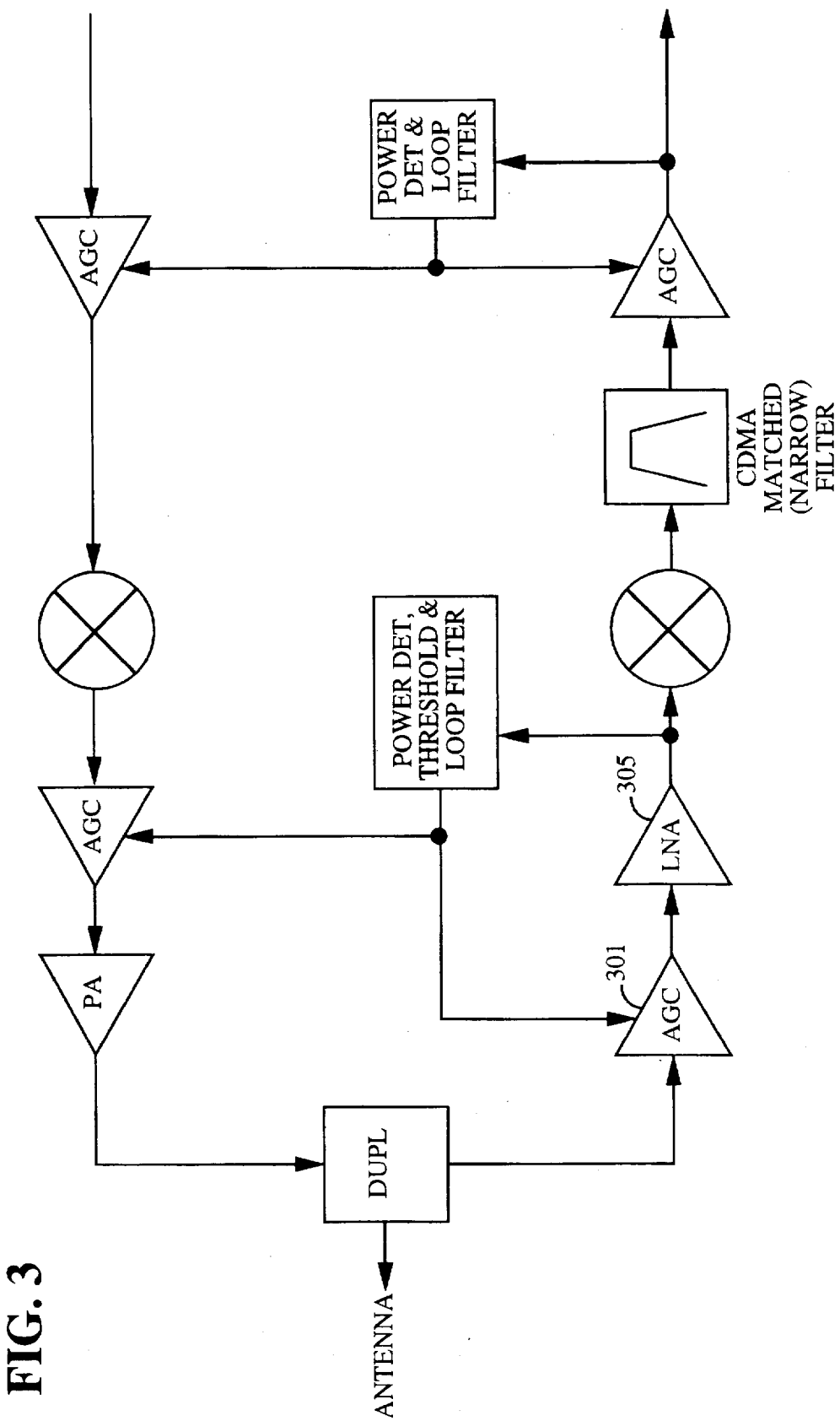
FIG. 3 shows a block diagram of another alternate embodiment of the present invention.

Still another embodiment of the present invention is illustrated in FIG 3. This embodiment operates similarly to the embodiment of FIG. 1. The only difference being the placement of the AGC (301) prior to the LNA (305) in the receive path.

Figure 4:
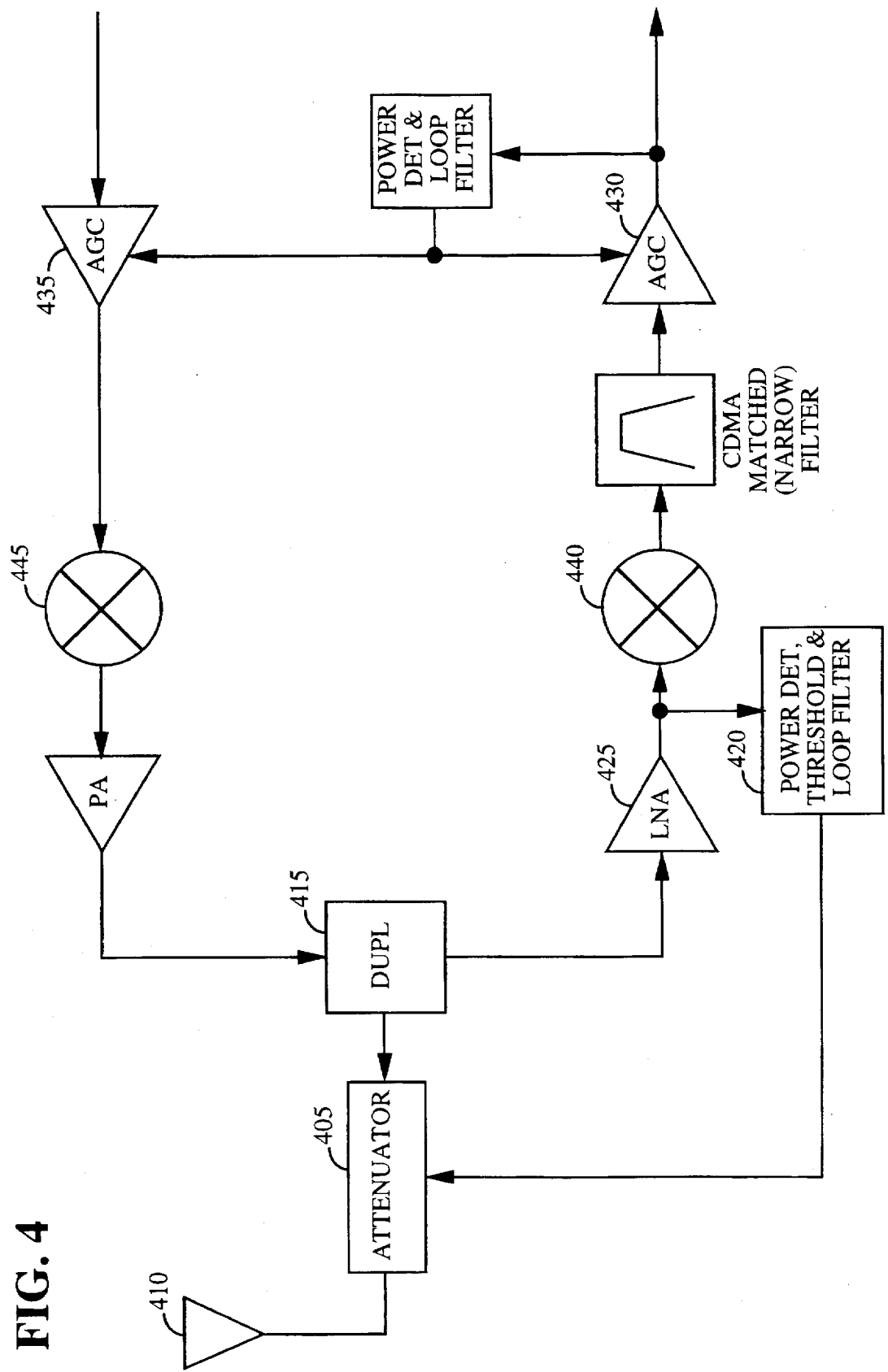
FIG. 4 shows a block diagram of another alternate embodiment of the present invention.

Yet another embodiment of the present invention is illustrated in FIG. 4. This embodiment uses an attenuator (405) between the antenna (410) and the duplexer (415). The attenuation is controlled by the power detector (420) after the LNA (425). The power detector (420) measures the received signal and jammer power, filters it, and compares it to a predetermined threshold. In this embodiment, the threshold is −25 dBm. When the combined signal and jammer power reaches this threshold, the attenuation caused by the attenuator (405) is increased. This adjustment can be either in digital fixed steps or continuously adjusted. The AGC (430 and 435) after the mixers (440 and 445) are adjusted in the same manner as the FIG. 1 preferred embodiment.

Figure 7:
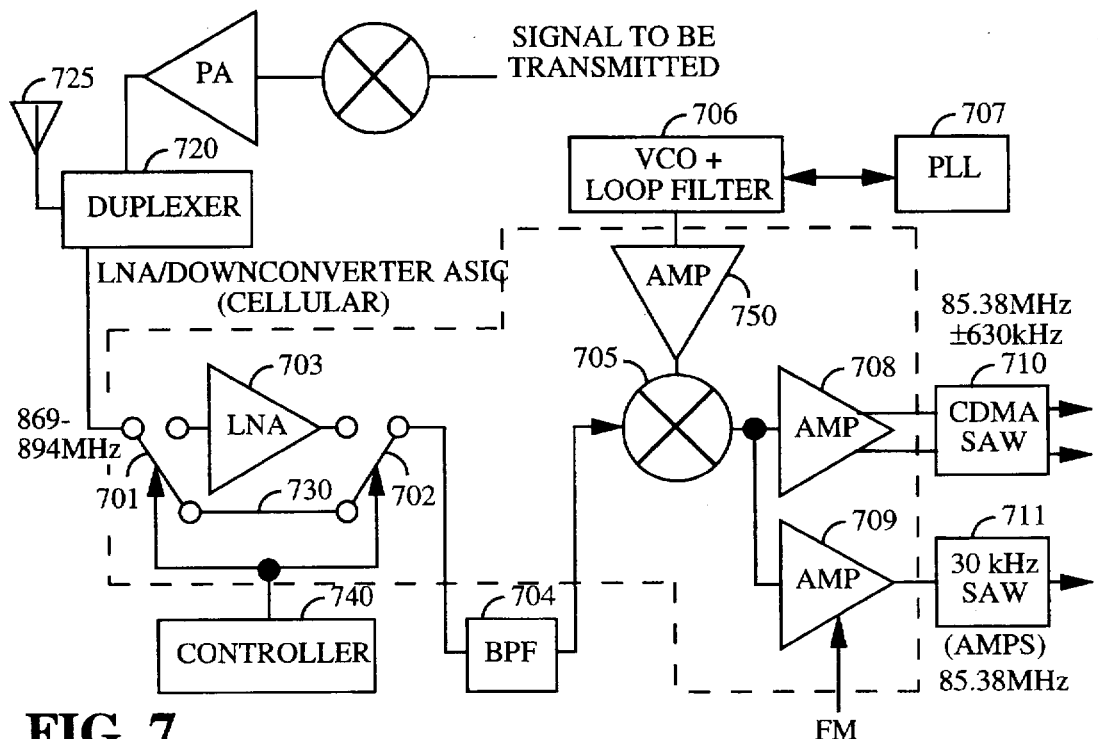
FIG. 7 shows a block diagram of another alternate embodiment of the present invention.

An alternate embodiment of the apparatus of the present invention is illustrated in FIG. 7. This embodiment uses switches to alter the front end gain. The actual switching level depends on the signal to noise requirements as a function of the signal level, or noise figure, for a particular CDMA radiotelephone design. The present invention can be used in an AMPS radiotelephone, however the switching characteristics will be changed to accommodate a different operating point.

This embodiment is comprised of an antenna that receives and transmits radio signals. Receive and transmit paths in the radio are coupled to the antenna (725) through a duplexer (720) that separates the received signals from the transmitted signals.

A received signal is input to a low noise amplifier (LNA) (703) that is coupled between two switches (701 and 702). One switch (701) couples the LNA (703) to the duplexer (720) and the second switch (702) couples the LNA (703) to a band-pass filter (704). In the preferred embodiment, the switches (701 and 702) are single-pole double-throw gallium arsenide switches.

The LNA (703) is coupled to one pole of each switch such that when both switches (701 and 702) are switched to those poles, the received signal is coupled to the LNA (703) and the amplified signal from the LNA (703) is output to the band-pass filter (704). The band-pass filter (704) in this embodiment has a frequency band of 869–894 MHz. Alternate embodiments use different bands depending on the frequencies of the signals being received.

A bypass path (730) is coupled to the other pole of each switch. When the switches (701 and 702) are switched to their other poles, the received signal from the duplexer (720) bypasses the LNA (703) and is conducted directly to the band-pass filter (704). In this embodiment, these switches (701 and 702) are controlled by the radiotelephone's microcontroller (740). In an alternate embodiment, a separate controller is used to control the positions of these switches.

After the band-pass filter has filtered the received signal, the filtered signal is downconverted to a lower intermediate frequency (IF) for use by the rest of the radio. The downconversion is done by mixing (705) the received signal with another signal having a frequency set by a phase locked loop (707) driving a voltage controlled oscillator (706). This signal is amplified (750) before being input to the mixer (705).

The downconverted signal from the mixer (705) is input to the back end AGC. This AGC is used by the radiotelephone for closed loop power control, as is already well known in the art.

In the process of the present invention, the microcontroller (740) monitors the power of the received signal. When the power exceeds −65 dBm, the microcontroller instructs the switches (701 and 702) to switch to the bypass position, thus coupling the received signal directly to the bandpass filter (704). By bypassing the LNA (703) gain, the intercept point for the receiver is increased proportionally by the reduction in gain in dB. Alternate embodiments use other circuitry and methods to monitor the power of the received signal.

An alternate embodiment of the process of the present invention continuously adjusts the front end gain. This embodiment uses a lower power threshold such as −25 dBm.

Figure 8:
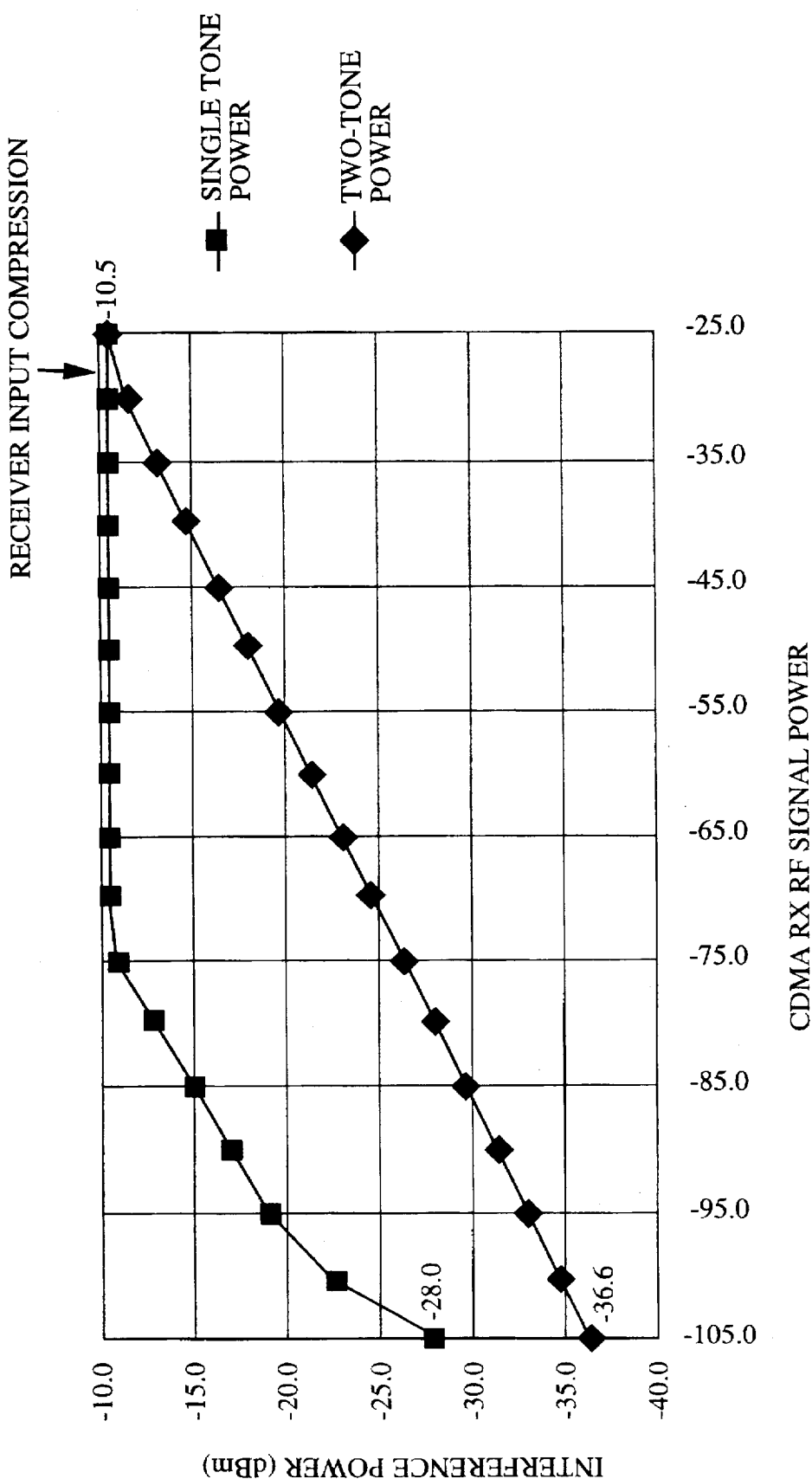
FIG. 8 shows a plot of interference power vs. signal power without using the apparatus of the present invention.
Figure 9:
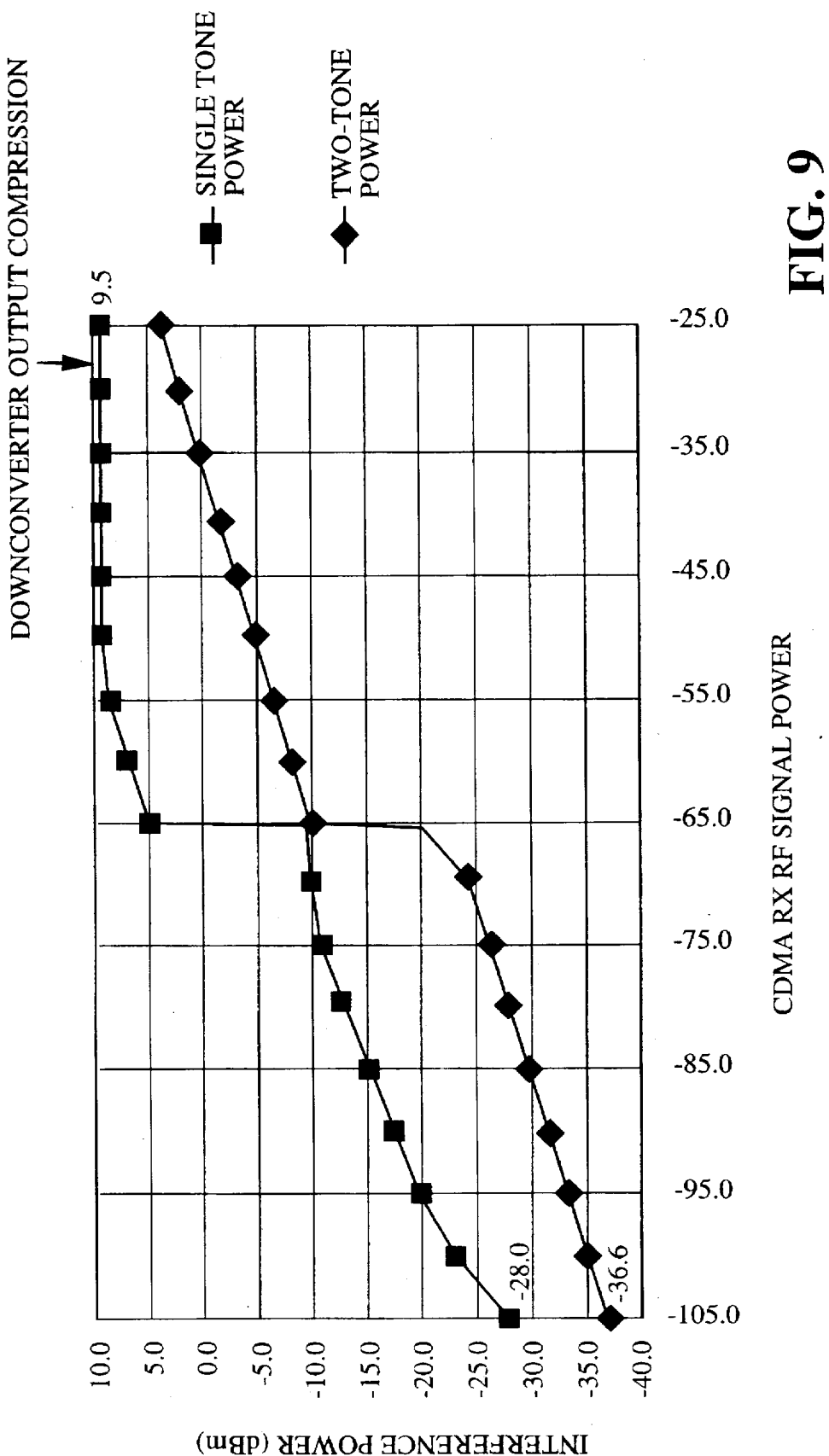
FIG. 9 shows a plot of interference power vs. signal power in accordance with the alternate embodiments of the apparatus of the present invention.

The plots of FIGS. 8 and 9 illustrate the benefits of the switchable gain embodiments of the present invention. FIG. 8 illustrates a plot of interference power versus radio frequency (RF) signal power for a typical radio that is not using the switchable gain apparatus. This plot shows that the maximum interference level is limited to the receiver input compression point at −10.5 dBm. Both the single and dual tone power curves are shown.

The plot of FIG. 9 shows the interference power received by the radio versus the radio frequency signal power received by the radio using the switchable gain method and apparatus of the present invention. It can be seen that at the −65 dBm point of the graph, the switches are switched to bypass the LNA gain thus allowing a greater interference power to be tolerated without affecting the RF signal power. Both the single tone and two tone power curves are shown.

Figure 10:
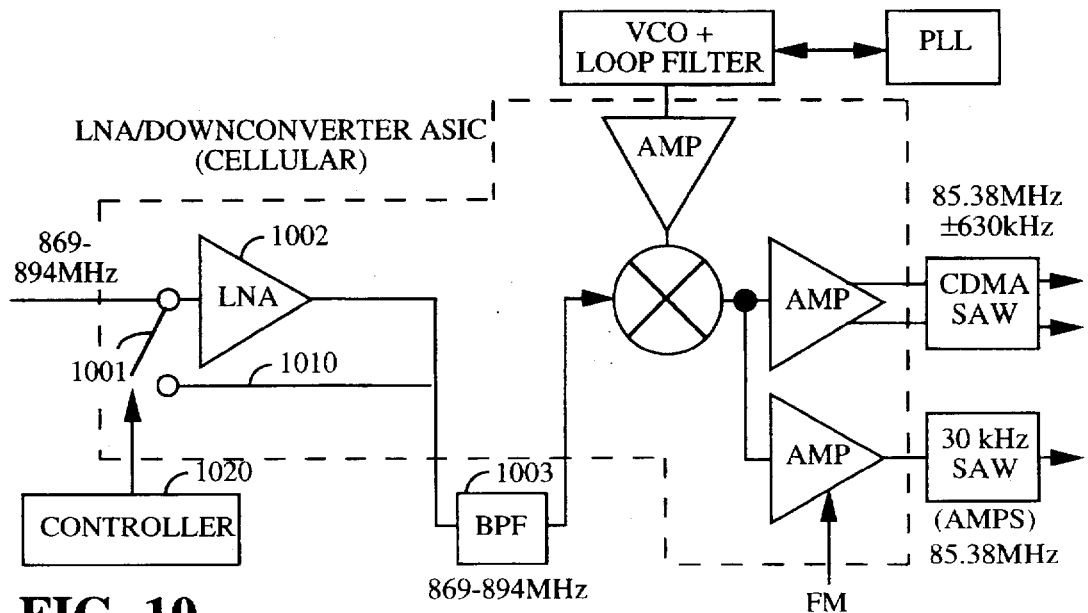
FIG. 10 shows a block diagram of an alternate embodiment of the present invention.

Another alternate embodiment of the apparatus of the present invention is illustrated in FIG. 10. This embodiment uses a single-pole single-throw switch (1001). In this embodiment, the switch (1001) is switched to the bypass path (1010) by the controller (1020) when the received signal power reaches −65 dBm. This effectively shorts out the LNA (1002) gain, thus coupling the received signal directly to the band-pass filter (1003).

Figure 11:
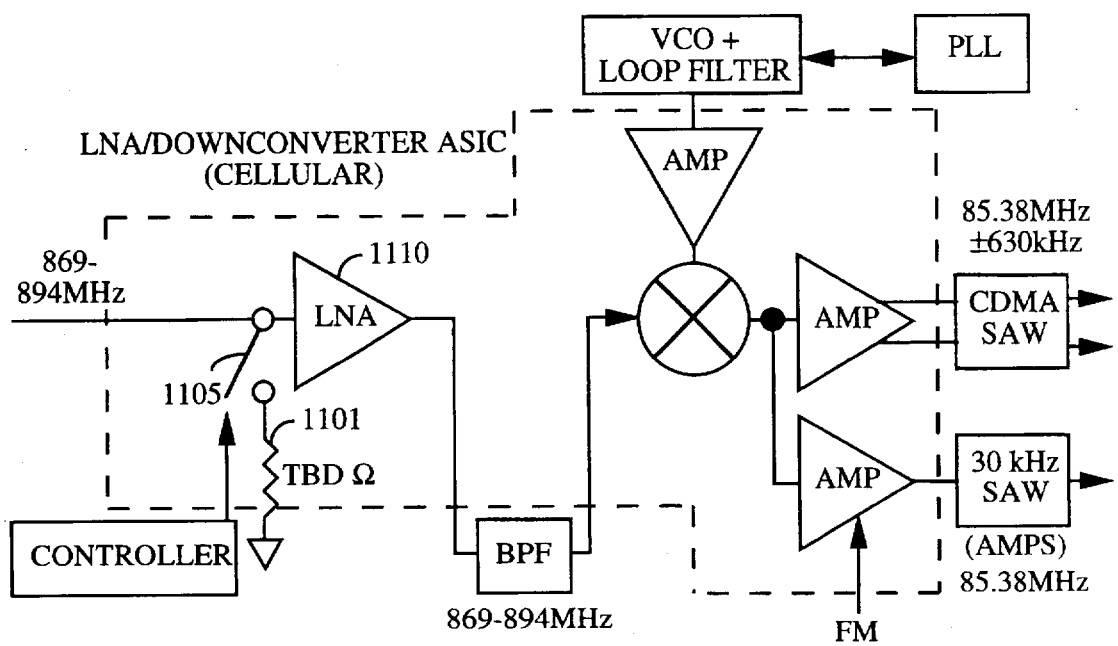
FIG. 11 shows a block diagram of another alternate embodiment of the present invention.

Yet another alternate embodiment of the apparatus of the present invention is illustrated in FIG. 11. This embodiment uses a single-pole single-throw switch (1105) that, when closed, shorts the input of the LNA (1110) to ground through a resistor (1101). This creates an impedance mismatch at the input causing the signal to attenuate, thus reducing the gain caused by the LNA (1110). As in the above embodiments, the switch (1105) is closed when the input signal power reaches −65 dBm. The resistance required for the resistor (1101) is dependent on the mount of attenuation desired. This resistance will be different for different LNA's in alternate embodiments.

Figure 12:
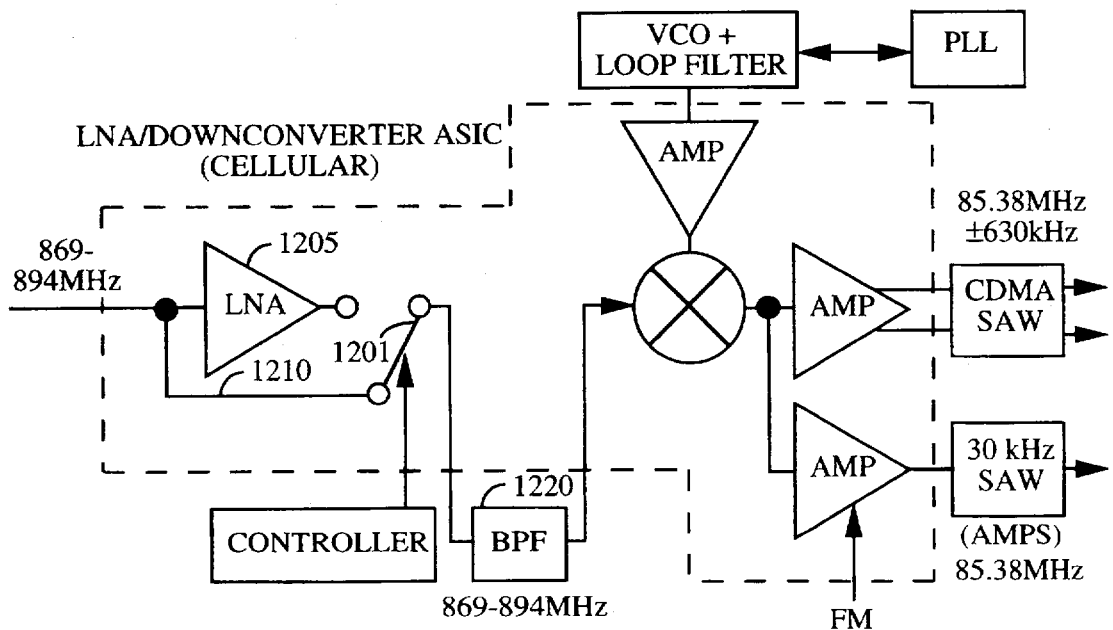
FIG. 12 shows a block diagram of another alternate embodiment of the present invention.
Figure 13:
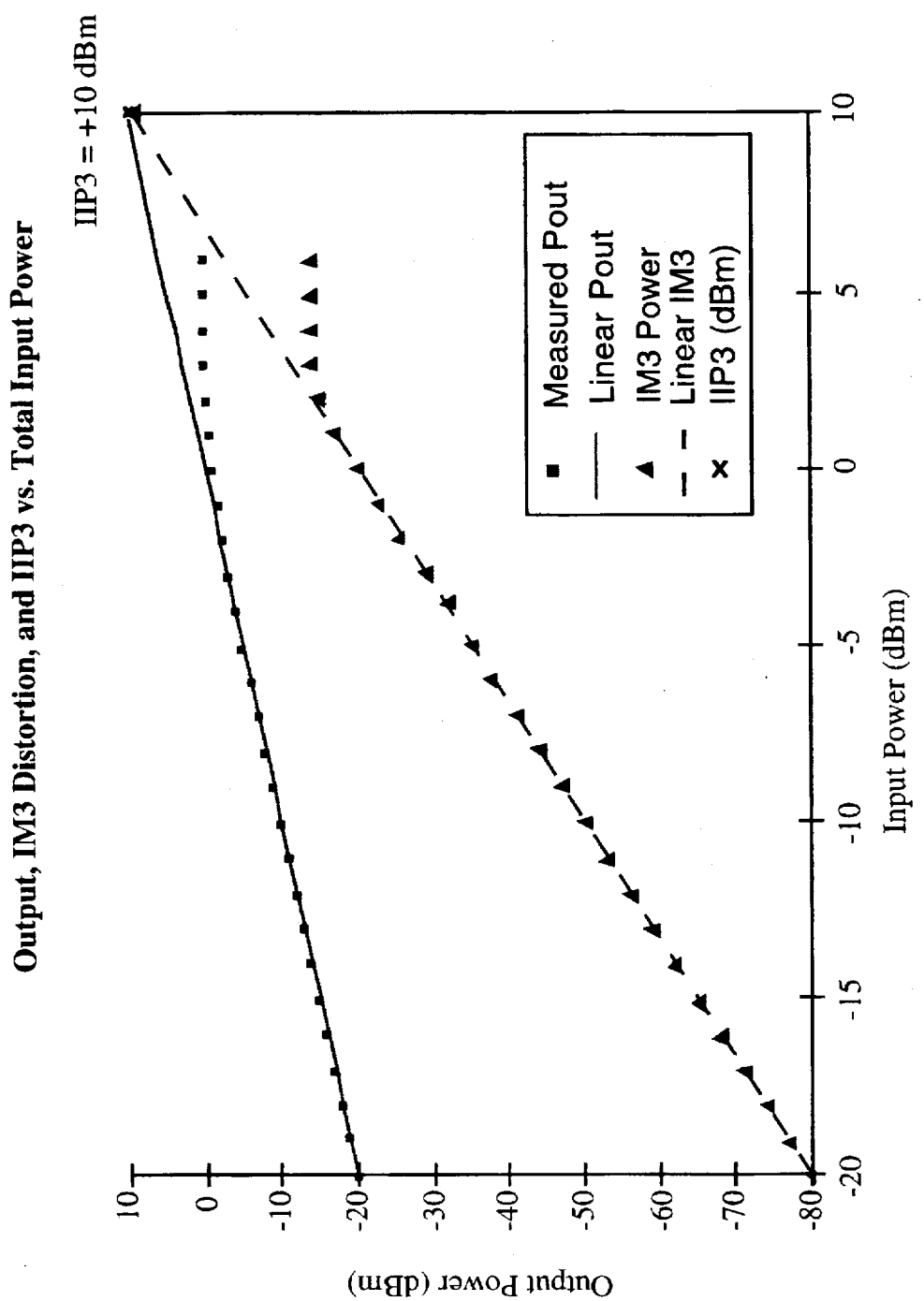
FIG. 13 shows a plot of non-linear transfer characteristics and distortion measurement.
Figure 14:
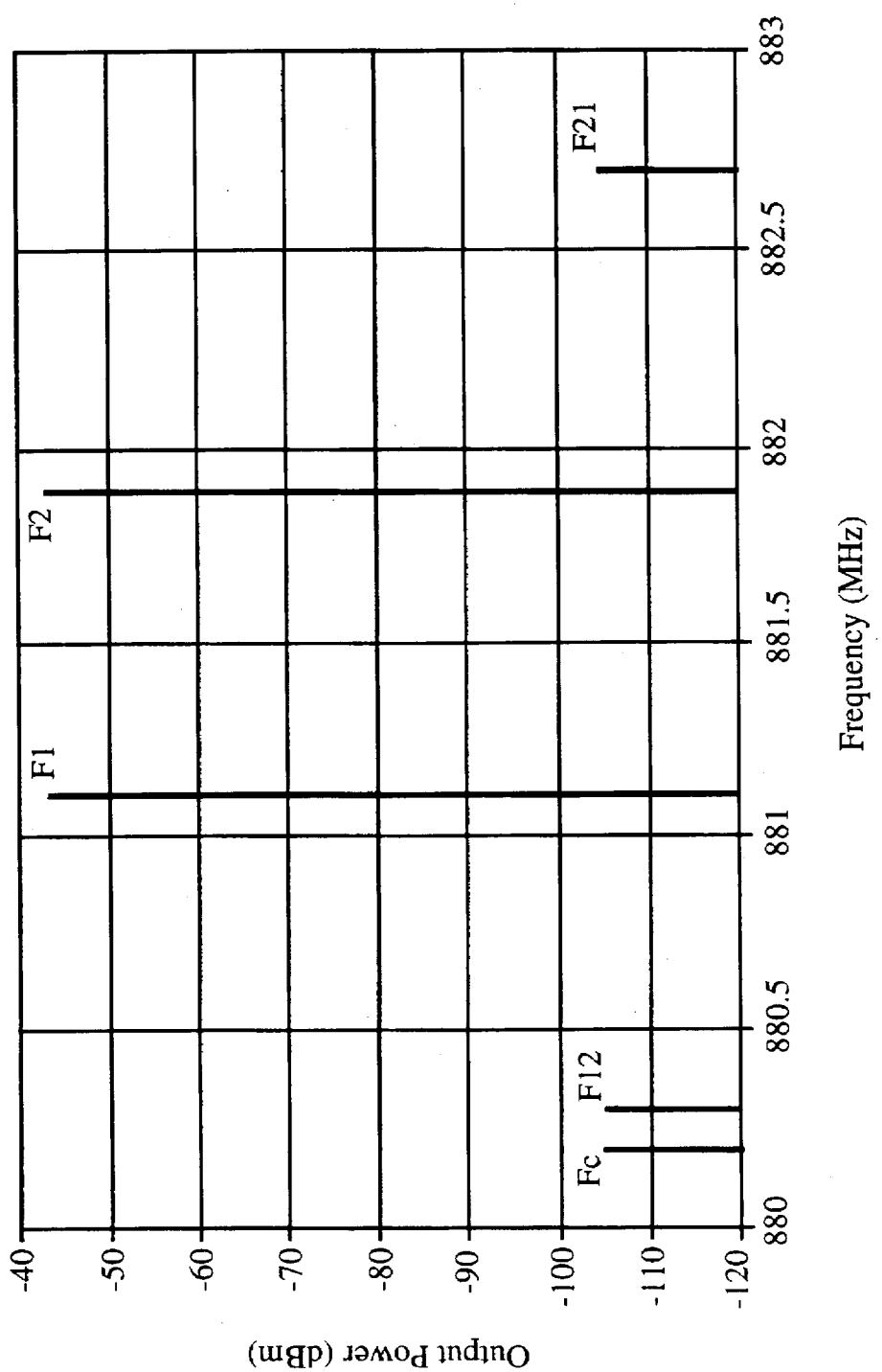
FIG. 14 shows a spectral description of distortion products.

Still another embodiment of the apparatus of the present invention is illustrated in FIG. 12. This embodiment uses a single-pole double-throw switch (1201) at the output of the LNA (1205). The LNA (1205) is connected to one pole of the switch (1201) and a bypass path (1210) is connected to the other pole. The input to the bypass path (1210) is connected to the input of the LNA (1205). When the power level of the received RF signal reaches −65 dBm, the switch (1201) is thrown from the position coupling the LNA (1205) to the bandpass filter (1220) to the bypass path (1210). This couples the signal directly to the band-pass filter (1220), bypassing the gain of the LNA (1205).

In all of the above embodiments, the LNA can be powered down at the same time that it is bypassed by the switch or switches. This can be accomplished by connecting the LNA's power pin to a switch that is also controlled by the controller. Once the LNA is bypassed and is no longer used, power can be removed. This reduces the power consumption of the radio, thus increasing the talk and standby time for which the battery can be used.

In another embodiment of the present invention, Ec/Io detection is used to determine when to adjust the front end gain. Additional embodiments use other quality measurements, such as Eb/Io.

These ratios are quality measurements for digital communications system performance. The Eb/Io ratio expresses the energy per bit to the total interference spectral density of the channel while the Eo/Io ratio expresses the energy per CDMA chip relative to the total interference spectral density. Eb/Io can be considered a metric that characterizes the performance of one communication system over another; the smaller the required Eo/Io the more efficient is the system modulation and detection process for a given probability of error. Given that Ec/Io and received signal strength are readily available, the microcontroller can detect the presence of strong interference as a drop in Ec/Io while the AGC detector detects the increased interference. The microcontroller can lower the front end gain to improve interference immunity which would improve Ec/Io and lower the distortion products falling within the signal bandwidth.

When the signal quality goes above the Eb/Io or Ec/Io threshold, the front end gain is reduced. The gain adjustment can be accomplished using either the continuous adjustment method or the amplifier switching method, both described above.

Figure 15:
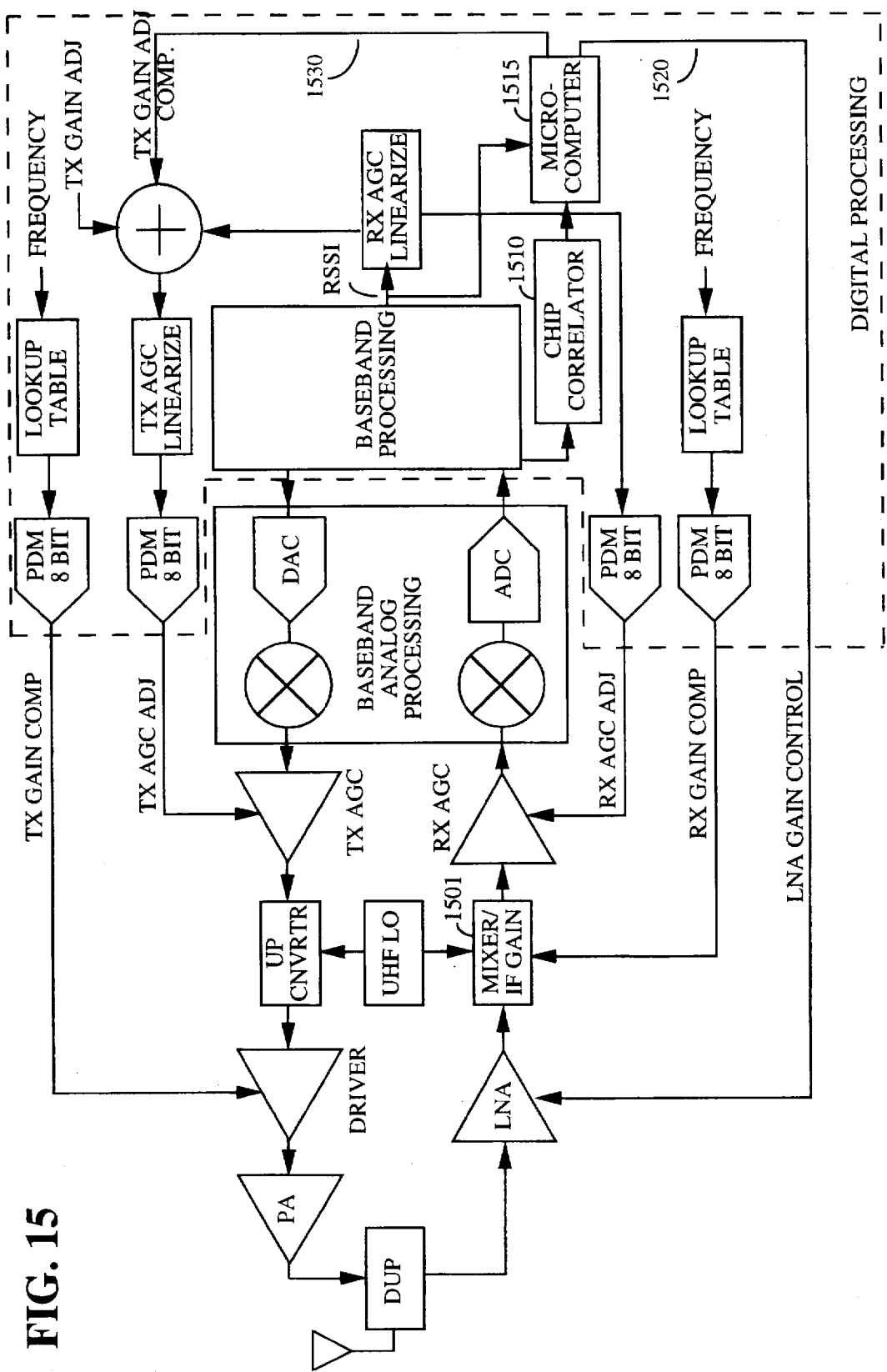
FIG. 15 shows a block diagram of a method for detecting the power of a received signal in accordance with the present invention.

Still another embodiment, illustrated in FIG. 15, would be to detect the signal power at IF or baseband instead of the combination of the signal and jammer power at RF. This approach is simpler in that there is only one power detector and AGC control loop.

FIG. 15 illustrates a block diagram of the alternate method of detecting the power of the received signal. The signal is first downconverted to baseband frequency (1501). This analog signal is then converted to a digital signal for further baseband processing including determining the received signal strength. The chip correlator (1510) determines the energy per chip with respect to the energy of all the non-coherent components. This information, along with the received signal strength indicator (RSSI) is used by the processor (1515) to determine the amount of gain adjustment for both the receive (1520) and transmit (1530) power.

Since the received signal power measurement includes both the signal and jammer power, the receive gain is increased only when both the signal level and the energy per chip drops. Since the RSSI is being changed, the transmit power must also be changed to compensate, thus enabling the open loop power control to operate properly. Thus, the processor adjusts the transmit gain whenever the receive gain is adjusted.

Other embodiments use erasures or signal power to control the variable gain AGC. Additional embodiments, instead of controlling both transmit and receive power, only control receiver power.

In summary, the apparatus and method of the present invention enables a mobile radio to travel near antennas of different systems while increasing the radio's resistance to radio frequency interference from the other system. By turning down the front end gain, whether continuously or discretely, the intercept point of the radio's receive circuitry increases so that the spurs from the other system's signals will not cause performance degradation of the receiver and demodulator.

We claim:

1. An apparatus to increase a radio receiver's immunity to radio frequency interference, the radio receiver receiving a signal, the apparatus comprising:

a first switch coupled to the received signal, the first switch having a first position and a second position, the second position being coupled to a bypass path;

a first amplifier, coupled to the first position of the first switch, for amplifying the received signal;

a second switch having a first position and a second position, the first position coupled to the first amplifier and the second position being coupled to the bypass path;

a controller coupled to the first switch and the second switch, the controller switching the first and second switches to the second positions in response to the received signal exceeding a predetermined power level;

a filter coupled to the output of the first amplifier, the filter outputting a filtered received signal at a filter output;

an oscillator for generating an oscillator signal having a predetermined frequency;

a mixer, having a first input and a second input, the first input being coupled to the filter output and the second input being coupled to the oscillator, the mixer generating a downconverted signal in response to the oscillator signal and the filtered received signal;

a second amplifier coupled to the downconverted signal;

a third amplifier coupled to the downconverted signal;

a first surface acoustical wave filter, coupled to the second amplifier, for generating a signal for use in a digital radiotelephone system; and a second surface acoustical wave filter, coupled to the third amplifier, for generating a signal for use in an analog radiotelephone system.

2. The apparatus of claim 1 wherein the predetermined power level is −65 dBm.

3. The apparatus of claim 1 wherein the first amplifier is a low noise amplifier.

4. An apparatus to increase a radio receiver's immunity to radio frequency interference, the radio receiver receiving a signal, the apparatus comprising:

a switch coupled to the received signal, the switch having an open position and a closed position, the closed position being coupled to a bypass path;

a first amplifier having an input coupled to the switch and an output coupled to the bypass path;

a controller coupled to the switch, for switching the switch to the closed position in response to the received signal exceeding a predetermined power level;

a filter coupled to the output of the first amplifier, the filter outputting a filtered received signal at a filter output;

an oscillator for generating an oscillator signal having a predetermined frequency;

a mixer, having a first input and a second input, the first input being coupled to the filter output and the second input being coupled to the oscillator, the mixer generating a downconverted signal in response to the oscillator signal and the filtered received signal;

second amplifier coupled to the downconverted signal;

a third amplifier coupled to the downconverted signal;

a first surface acoustical wave filter, coupled to the second amplifier, for generating a signal for use in a digital radiotelephone system; and a second surface acoustical wave filter, coupled to the third amplifier, for generating a signal for use in an analog radiotelephone system.

5. An apparatus to increase a radio receiver's immunity to radio frequency interference, the radio receiver receiving a signal, the apparatus comprising:

a first amplifier, having an input coupled to the received signal, for generating an amplified received signal at an output;

a bypass path coupled to the input of the first amplifier;

a switch having a first position and a second position, the first position coupled to the first amplifier output and the second position being coupled to the bypass path;

a controller coupled to the switch, for switching the switch from the first position to the second position in response to the received signal exceeding a predetermined power level;

a filter coupled to the output of the first amplifier, the filter outputting a filtered received signal at a filter output;

an oscillator for generating an oscillator signal having a predetermined frequency;

a mixer, having a first input and a second input, the first input being coupled to the filter output and the second input being coupled to the oscillator, the mixer generating a downconverted signal in response to the oscillator signal and the filtered received signal;

a second amplifier coupled to the downconverted signal;

a third amplifier coupled to the downconverted signal;

a first surface acoustical wave filter, coupled to the second amplifier, for generating a signal for use in a digital radiotelephone system; and a second surface acoustical wave filter, coupled to the third amplifier, for generating a signal for use in an analog radiotelephone system.

6. A receiver circuit for increasing immunity of a radiotelephone to radio frequency interference, said radiotelephone having an antenna for receiving and transmitting radio signals, a duplexer coupled to said antenna, and a signal processing circuit coupled to said duplexer, the receiver circuit comprising:

a receive amplifier, having an input and an output, said receive amplifier for amplifying said received radio signals;

a bypass path, switchably coupled to said receive amplifier, said bypass path for attenuating a gain of said receive amplifier when in a shunt position;

a controller, coupled to said bypass path, for switching said bypass path to said shunt position when a detected power level of said received radio signals exceeds a predetermined threshold;

filter coupled to the output of the receive amplifier, the filter outputting a filtered received signal at a filter output;

an oscillator for generating an oscillator signal having a predetermined frequency;

a mixer, having a first input and a second input, the first input being coupled to the filter output and the second input being coupled to the oscillator, the mixer generating a downconverted signal in response to the oscillator signal and the filtered received signal;

a second amplifier coupled to the downconverted signal;

a third amplifier coupled to the downconverted signal;

a first surface acoustical wave filter, coupled to the second amplifier, for generating a signal for use in a digital radiotelephone system; and a second surface acoustical wave filter, coupled to the third amplifier, for generating a signal for use in an analog radiotelephone system.

7. The receiver circuit of claim 6 wherein said bypass path comprises a first switch having an input coupled to said duplexer, and having a series position, a shunt position, and an output, said first switch output being coupled to said receive amplifier input when said first switch is in said series position and said first switch output being coupled to an input of a second switch when said first switch is in said shunt position, said second switch having an output coupled to said signal processing circuit, and having a series position and a shunt position, said second switch input being coupled to said receive amplifier output when said second switch is in said series position and said second switch input being coupled to said first switch output when said second switch is in said shunt position.

8. The circuit of claim 6 wherein said bypass path comprises a switch having an input coupled to said duplexer and having an output coupled to said receive amplifier output when said bypass path is in said shunt position.

9. The circuit of claim 6 wherein said bypass path comprises a switch having an output coupled to said signal processing circuit, and having an input coupled to said receive amplifier input when said bypass path is in said shunt position.

10. The circuit of claim 6 wherein said bypass path comprises a switchable load having an output coupled to a ground potential and having an input coupled to said receive amplifier input when said bypass path is in said shunt position.

* * * * *